(12) United States Patent
Tani et al.

(10) Patent No.: US 9,607,549 B2
(45) Date of Patent: Mar. 28, 2017

(54) ORGANIC LIGHT EMITTING DIODE DISPLAY PANEL AND ORGANIC LIGHT EMITTING DIODE DISPLAY DEVICE

(71) Applicant: LG Display Co., Ltd., Seoul (KR)

(72) Inventors: Ryosuke Tani, Gyeonggi-do (KR); SungJin Hong, Gyeonggi-do (KR); NaYoung Bae, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/919,934

(22) Filed: Oct. 22, 2015

(65) Prior Publication Data

US 2016/0189614 A1 Jun. 30, 2016

(30) Foreign Application Priority Data

Dec. 24, 2014 (KR) .................. 10-2014-0188254
Aug. 4, 2015 (KR) .................. 10-2015-0109834

(51) Int. Cl.
*G09G 3/3258* (2016.01)
*G09G 3/3266* (2016.01)
*G09G 3/3291* (2016.01)
*H01L 27/32* (2006.01)

(52) U.S. Cl.
CPC ......... *G09G 3/3258* (2013.01); *G09G 3/3266* (2013.01); *G09G 3/3291* (2013.01); *H01L 27/3265* (2013.01); *G09G 2300/0426* (2013.01); *G09G 2310/0289* (2013.01); *G09G 2310/08* (2013.01); *G09G 2320/0233* (2013.01); *G09G 2380/02* (2013.01)

(58) Field of Classification Search
CPC ... G09G 2300/0426; G09G 2310/0289; G09G 2310/08; G09G 2320/0233; G09G 2380/02; G09G 3/3258; G09G 3/3266; G09G 3/3291; H01L 27/3265
USPC .................................................. 345/76, 211
See application file for complete search history.

(56) References Cited

U.S. PATENT DOCUMENTS

| | | | |
|---|---|---|---|
| 2015/0001504 A1* | 1/2015 | Kim ................. | H01L 27/32 257/40 |
| 2015/0049075 A1* | 2/2015 | Lim ................. | G09G 5/397 345/212 |
| 2015/0061981 A1* | 3/2015 | Lee ................. | G09G 3/3291 345/77 |
| 2015/0077314 A1* | 3/2015 | Kim ................. | G09G 3/3233 345/76 |
| 2015/0123953 A1* | 5/2015 | Shim ............... | G09G 3/3233 345/205 |
| 2015/0154899 A1* | 6/2015 | Chang ............. | G09G 3/3233 345/76 |
| 2015/0187268 A1* | 7/2015 | Tani ................ | G09G 3/3233 345/77 |
| 2016/0086544 A1* | 3/2016 | Park ................ | G09G 3/3233 345/690 |
| 2016/0111042 A1* | 4/2016 | Pyeon ............. | G09G 3/3208 345/212 |

(Continued)

*Primary Examiner* — Dmitriy Bolotin
(74) *Attorney, Agent, or Firm* — Morgan, Lewis & Bockius LLP

(57) ABSTRACT

An organic light-emitting diode display panel and an OLED display device have a sensing driving stabilizer that can increase accuracy in sensing and compensation by providing potential stability to a reference voltage line acting as a sensing line during the sensing driving.

14 Claims, 15 Drawing Sheets

(56) References Cited

U.S. PATENT DOCUMENTS

| | | | |
|---|---|---|---|
| 2016/0117991 A1* | 4/2016 | Ha | G09G 3/3291 |
| | | | 345/78 |
| 2016/0189595 A1* | 6/2016 | Choi | G06F 1/04 |
| | | | 345/212 |
| 2016/0189599 A1* | 6/2016 | Lee | G01R 31/025 |
| | | | 345/211 |
| 2016/0189628 A1* | 6/2016 | Choi | G09G 3/3291 |
| | | | 345/690 |

* cited by examiner

ORGANIC LIGHT EMITTING DIODE DISPLAY PANEL AND ORGANIC LIGHT EMITTING DIODE DISPLAY DEVICE

CROSS REFERENCE TO RELATED APPLICATION

This application claims priority from and the benefit under 35 U.S.C. §119(a) of Korean Patent Application Number 10-2014-0188254 filed on Dec. 24, 2014 and 10-2015-0109834 filed on Aug. 4, 2015, which is hereby incorporated by reference for all purposes as if fully set forth herein.

BACKGROUND OF THE INVENTION

Field of the Invention

The present invention relates to an organic light-emitting diode (OLED) display panel and an OLED display device.

Discussion of Related Art

Organic light-emitting diode (OLED) display devices (also referred to as organic light-emitting display devices) have recently been prominent as next generation display devices. Such OLED display devices have inherent advantages, such as relatively fast response speeds, high contrast ratios, high light emitting efficiency, high luminance levels, and wide viewing angles, since OLEDs able to emit light by themselves are used therein.

Each sub-pixel disposed on an OLED display panel (also referred to as an organic light-emitting display panel) basically includes a driving transistor driving an OLED, a switching transistor transmitting a data voltage to a gate node of the driving transistor, and a capacitor maintaining a certain level of voltage for a period of a single frame.

The driving transistor in each sub-pixel has characteristics that may differ according to driving transistors, such as a threshold voltage and mobility thereof.

The driving transistors may deteriorate along with the lapse of driving period, whereby the characteristics thereof change. Since the driving transistors may experience different degrees of deterioration during the same driving time, the characteristics of one driving transistor may have a difference from those of another driving transistor.

Such differences in the characteristics between the driving transistors may produce differences in degrees of luminance, leading to non-uniform luminance in the OLED display panel.

Therefore, technologies for compensating for the differences in characteristics by sensing the characteristics of individual driving transistors have been developed. However, regardless of the compensation for the differences in the characteristics of the individual driving transistors, the sensed values thereof change for certain reasons, thereby lowering the accuracy of sensing. Thus, there has not been proper compensation for the differences in characteristics (i.e. compensation for the luminance differences) to date. This problem consequently leads to poor image quality.

SUMMARY OF THE INVENTION

Accordingly, the present invention is directed to an organic light emitting diode display panel and an organic light emitting diode display device that substantially obviates one or more of the problems due to limitations and disadvantages of the related art.

An object of the present invention is to provide an organic light-emitting diode (OLED) display panel and an OLED display device having increased accuracy in sensing the characteristics of a driving transistor, whereby accurate compensation is enabled.

Another object of the present invention is to provide an OLED display panel and an OLED display device having a sensing driving stabilizer that can increase accuracy in sensing the characteristics of the driving transistor.

Another object of the present invention is to provide an OLED display panel and an OLED display device having a sensing driving stabilizer that can increase accuracy in sensing and compensation by providing potential stability to a reference voltage line acting as a sensing line during the sensing driving.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an OLED display device comprises an OLED display panel on which a plurality of data lines, a plurality of gate lines, and a plurality of sub-pixels are disposed; a data driver driving the plurality of data lines; a gate driver driving the plurality of gate lines; and a timing controller controlling the data driver and the gate driver.

In this OLED display device, each of the sub-pixels includes: an OLED; a driving transistor driving the OLED; a sensing transistor electrically connected between a first node of the driving transistor and a reference voltage line; a switching transistor electrically connected between a second node of the driving transistor and a data line; and a storage capacitor electrically connected between the first node and the second node of the driving transistor.

The OLED display device may further include a stabilizing capacitor electrically connected to or disconnected from the reference voltage line depending on a driving mode.

The stabilizing capacitor may be electrically connected to the reference voltage line in the section of a sensing driving mode, and may be electrically disconnected from the reference voltage line in the section of a display driving mode.

The stabilizing capacitor is disposed on the organic OLED display panel or outside the OLED display panel.

In another aspect, an OLED display panel comprises a plurality of data lines; a plurality of gate lines arranged in a direction crossing the plurality of data lines; and a plurality of sub-pixels arranged in the shape of a matrix.

In this OLED display panel, each of the sub-pixels includes: an OLED; a driving transistor driving the OLED; a sensing transistor electrically connected between a first node of the driving transistor and a reference voltage line; a switching transistor electrically connected between a second node of the driving transistor and a data line; and a storage capacitor electrically connected between the first node and the second node of the driving transistor.

The OLED display panel may further include a stabilizing capacitor disposed thereon, the stabilizing capacitor being electrically connected to or disconnected from the reference voltage line depending on a driving mode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
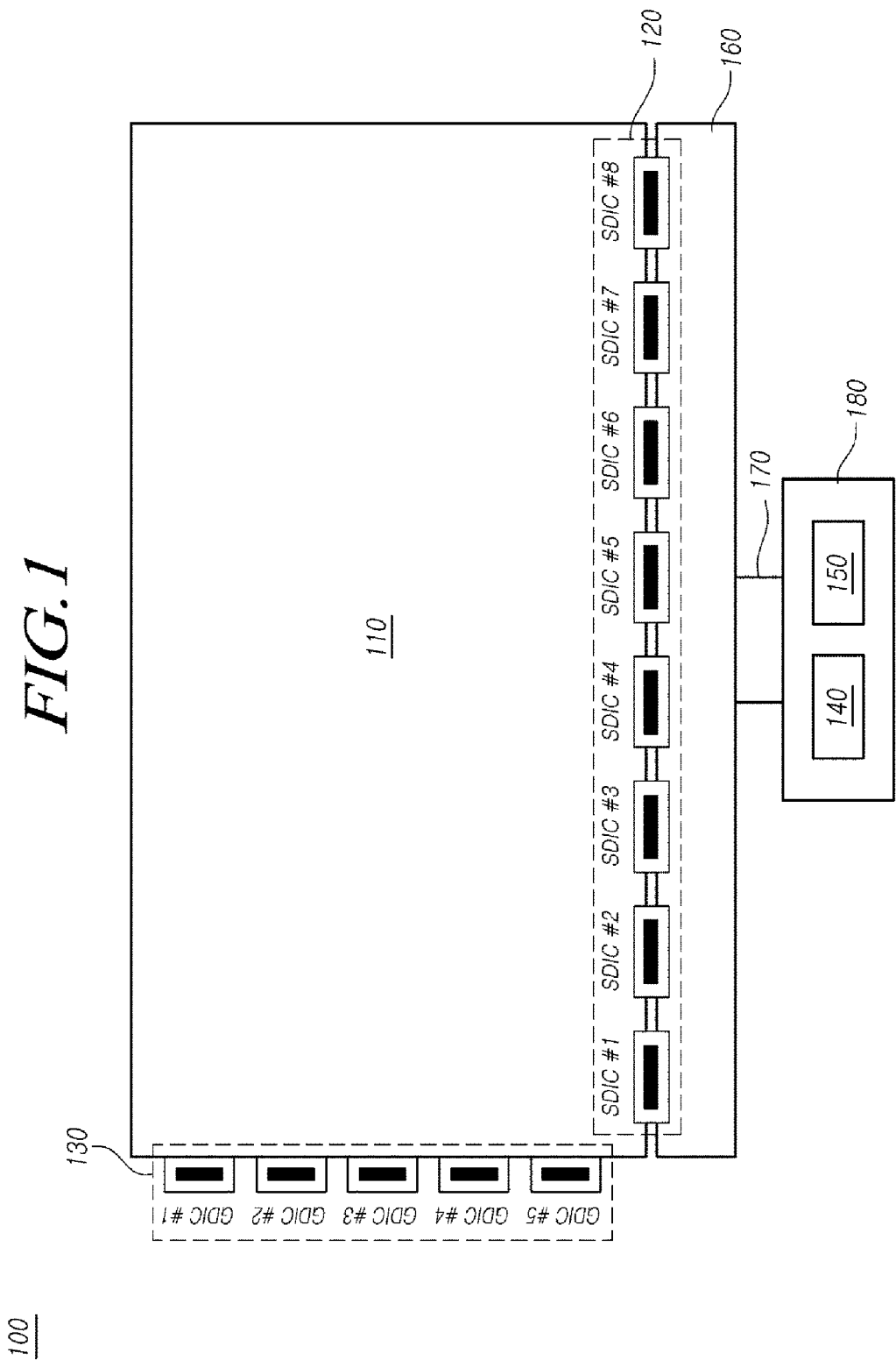
FIG. 1 is a schematic system configuration view illustrating an OLED display device according to example embodiments of the present invention.

Reference will now be made in detail to the present invention, embodiments of which are illustrated in the accompanying drawings. Throughout this document, reference should be made to the drawings, in which the same reference numerals and signs may be used throughout the different drawings to designate the same or similar components. In the following description of the present invention, detailed descriptions of known functions and components incorporated herein will be omitted in the case that the subject matter of the present invention may be rendered unclear thereby.

It will also be understood that, although terms such as "first," "second," "A," "B," "(a)" and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected" or "coupled to" the other element, but also can it be "indirectly connected or coupled to" the other element via an "intervening" element. In the same context, it will be understood that when an element is referred to as being formed "on" or "under" another element, not only can it be directly formed on or under another element, but also can it be indirectly formed on or under another element via an intervening element.

FIG. 1 is a schematic system configuration view illustrating an organic light-emitting diode (OLED) display device 100 according to example embodiments of the present invention.

Referring to FIG. 1, the OLED display device 100 includes an OLED display panel 110, a data driver 120, a gate driver 130, and a timing controller 140.

A plurality of data lines and a plurality of gate lines intersecting the plurality of data lines are disposed on the OLED display panel 110.

In addition, a plurality of sub-pixels is disposed in the shape of a matrix on the OLED display panel 110.

The data driver 120 drives the plurality of data lines by supplying data voltages to the plurality of data lines.

The gate driver 130 sequentially drives the plurality of gate lines by sequentially supplying a scanning signal to the plurality of gate lines.

The timing controller 140 controls the data driver 120 and the gate driver 130 by supplying a control signal to the data driver 120 and the gate driver 130.

The timing controller 140 starts scanning based on timing set in each frame, outputs converted image data produced by converting incoming input data according to a data signal format used in the data driver 120, and regulates data driving at an appropriate point of time according to the scanning.

The gate driver 130 sequentially drives the plurality of gate lines by sequentially supplying an on-voltage signal or an off-voltage signal to the plurality of gate lines under the control of the timing controller 140.

The gate driver 130 is positioned on one side of the OLED display panel 110 as in FIG. 1, or may be divided into two sections positioned on opposite sides of the OLED display panel 110 according to a driving scheme.

In addition, the gate driver 130 includes one or more gate driver ICs (gate driver ICs). Referring to FIG. 1, five gate driver ICs GDIC #1 to GDIC #5 are illustrated for the sake of explanation.

Each of the gate driver ICs GDIC #1 to GDIC #5 is connected to the bonding pads of the OLED display panel 110 by a tape automated bonding (TAB) method or a chip on glass (COG) method, or is implemented as a gate-in-panel (GIP) type circuit directly disposed on the OLED display panel 110. In some cases, each of the gate driver ICs GDIC #1 to GDIC #5 may be integrated with the OLED display panel 110.

Each of the gate driver ICs GDIC #1 to GDIC #5 includes a shift register, a level shifter, an output buffer, and the like.

When a specific gate line is opened, the data driver 120 drives the plurality of data lines by converting an image data received from the timing controller 140 to an analog data voltage and supplying the analog data voltage to the plurality of data lines.

The data driver 120 includes one or more source driver ICs (source driver ICs; also referred to as data driver integrated circuits). Referring to FIG. 1, eight source driver ICs SDIC #1 to SDIC #8 are illustrated for the sake of explanation.

Each of the source driver ICs SDIC #1 to SDIC #8 is connected to the bonding pads of the OLED display panel 110 by a tape automated bonding (TAB) method or a chip on glass (COG) method, or is directly disposed on the OLED display panel 110. In some cases, each source driver IC may be integrated with the OLED display panel 110.

In addition, each of the source driver ICs SDIC #1 to SDIC #8 may be embodied by a chip-on-bonding (COB) method. In each of the source driver ICs SDIC #1 to SDIC #8, one end is bonded to a source printed circuit board (PCB) 160, and the other end is bonded to the OLED display panel 110.

Each of the source driver ICs SDIC #1 to SDIC #8 includes a shift register, a latch, a digital-to-analog converter (DAC), an output buffer, and the like. In some cases, each source driver IC may further include an analog-to-digital converter (ADC) that senses an analog voltage value, converts the analog voltage value to a digital voltage value, and outputs the digital voltage value for the purpose of sub-pixel compensation.

The timing controller 140 receives a variety of timing signals, as well as image data of an incoming input image. The variety of timing signals may include a vertical synchronization signal Vsync, a horizontal synchronization signal Hsync, an input data enable signal DE, a clock signal CLK, or the like.

The timing controller 140 receives timing signals, such as the vertical synchronization signal, the horizontal synchronization signal, the input data enable signal, and the clock signal, generates a variety of control signals, and outputs the control signals to the data driver 120 and the gate driver 130 in order to control the data driver 120 and the gate driver 130, in addition to outputting converted image data produced by converting incoming image data according to the data signal format used in the data driver 120.

For example, the timing controller 140 outputs a variety of gate control signals (GCSs) including a gate start pulse (GSP), a gate shift clock signal (GSC) and a gate output enable signal (GOE) in order to control the gate driver 130. The gate start pulse controls the operation start timing of the one or more gate driver ICs GDIC #1 to GDIC #5 of the gate driver 130. The gate shift clock signal is a clock signal commonly input to the one or more gate driver ICs GDIC #1 to GDIC #5 to control the shift timing of the scanning signal (gate pulse). The gate output enable signal designates the timing information of the one or more gate driver ICs GDIC #1 to GDIC #5.

The timing controller 140 outputs a variety of data control signals (DCSs) including a source start pulse (SSP), a source sampling clock signal (SSC) and a source output enable signal (SOE) in order to control the data driver 120. The source start pulse controls the data sampling start timing of the one or more source driver ICs SDIC #1 to SDIC #8 of the data driver 120. The source sampling clock signal is a clock signal to control the data sampling timing of each of the source driver ICs SDIC #1 to SDIC #8. The source output enable signal controls the output timing of the data driver 120.

Referring to FIG. 1, the timing controller 140 is disposed on a control PCB 180. The control PCB 180 is connected to the source PCB 160 to which the source driver ICs SDIC #1 to SDIC #8 are bonded via a connecting means 170, such as a flexible flat cable (FFC) or a flexible printed circuit (FPC).

The control PCB 180 further has a power controller 150 disposed thereon. The power controller 150 supplies a variety of voltages or currents to the OLED display panel 110, the data driver 120, the gate driver 130, and the like, or controls the variety of voltages or currents to be supplied to the OLED display panel 110, the data driver 120, the gate driver 130, and the like. The power controller is also referred to as the power management IC (PMIC).

Although the source PCB 160 is illustrated as being a single PCB in FIG. 1, this is for illustrative purposes only. Two or more source PCBs 160 may be provided when the gate driver ICs are disposed on opposite sides of the OLED display panel 110 or the number of the source driver ICs is increased.

In addition, although the source PCB 160 and the control PCB 180 are illustrated in FIG. 1 as being separately configured, this is for illustrative purposes only. The source PCB 160 and the control PCB 180 may be implemented as a single PCB.

Circuit devices, such as a transistor and a capacitor, are formed on each of sub-pixels disposed on the OLED display panel 110 that is schematically illustrated in FIG. 1. For example, a circuit including an OLED, two or more transistors, and one or more capacitors is formed on each of the sub-pixels on the OLED display panel 110.

A description of a sub-pixel circuit will be given below by way of example with reference to FIG. 2 and FIG. 3.

Figure 2:
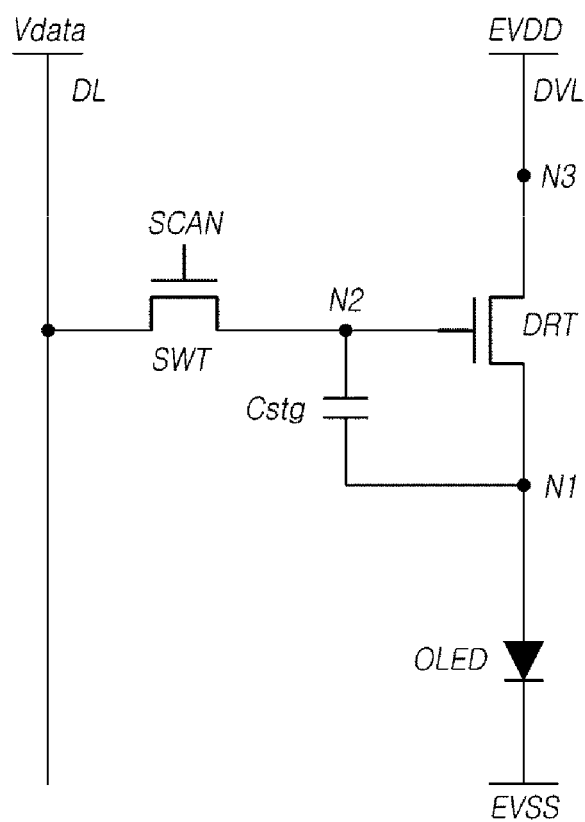
FIG. 2 illustrates an example of a sub-pixel circuit of the OLED display device according to example embodiments of the present invention.

FIG. 2 illustrates an example of the sub-pixel circuit of the OLED display device 100 according to example embodiments of the present invention.

Referring to FIG. 2, in the OLED display device 100 according to example embodiments of the present invention, each sub-pixel includes an OLED and a driving circuit driving the OLED.

Referring to FIG. 2, the driving circuit basically includes two transistors (a driving transistor DRT and a switching transistor SWT) and one capacitor (storage capacitor Cstg).

Referring to FIG. 2, the OLED includes a first electrode (e.g. an anode electrode or a cathode electrode), an organic layer, and a second electrode (e.g. a cathode electrode or an anode electrode).

For example, a first node N1 (e.g. a source node or a drain node) of the driving transistor DRT may be electrically connected to the first electrode of the OLED, and a base voltage EVSS (e.g., a lower supply voltage, e.g. a ground voltage) may be applied to the second electrode of the OLED.

Referring to FIG. 2, the driving transistor DRT is a transistor that supplies a driving current to the OLED to drive the OLED.

The driving transistor DRT includes the first node N1 corresponding to the source node or the drain node, a second node N2 corresponding to a gate node, and a third node N3 corresponding to the drain node or the source node. The driving transistor DRT may be an n-transistor or a p-transistor.

For example, in the driving transistor DRT, the first node N1 may be electrically connected to the first electrode or the second electrode of the OLED, and the third node N3 may be electrically connected to a driving voltage line DVL through which a driving voltage EVDD is supplied.

Referring to FIG. 2, the switching transistor SWT is a transistor that supplies a data voltage Vdata to the second node N2 corresponding to the gate node of the driving transistor DRT.

The switching transistor SWT is controlled by a scanning signal SCAN applied to the gate node, and is electrically connected between the second node N2 of the driving transistor DRT and a data line DL.

Referring to FIG. 2, the storage capacitor Cstg is electrically connected between the first node N1 and the second node N2 of the driving transistor DRT.

The storage capacitor Cstg serves to maintain a predetermined voltage for a period of a single frame.

The sub-pixel structure illustrated in FIG. 2 is the most basic possible 2T1C structure including two transistors DRT and SWT, one capacitor Cstg, and one OLED.

The sub-pixel structure may be variously modified according to various design objectives intended to improve image quality.

For example, the sub-pixel may have a compensation structure that compensates for the unique characteristics of the driving transistor DRT, such as a threshold voltage Vth and mobility. The compensation structure may have a variety of types, one of which may be decided depending on the type of the driving transistor DRT and the size and resolution of the OLED display panel 110.

The term "compensation" as used herein indicates compensation for the characteristics of the driving transistor DRT. This should be interpreted as being consistent with the compensation for the luminance of the sub-pixel. This also should be interpreted as being consistent with either the compensation for the differences in the characteristics between the driving transistors DRT or the compensation for the luminance differences between the sub-pixels.

Figure 3:
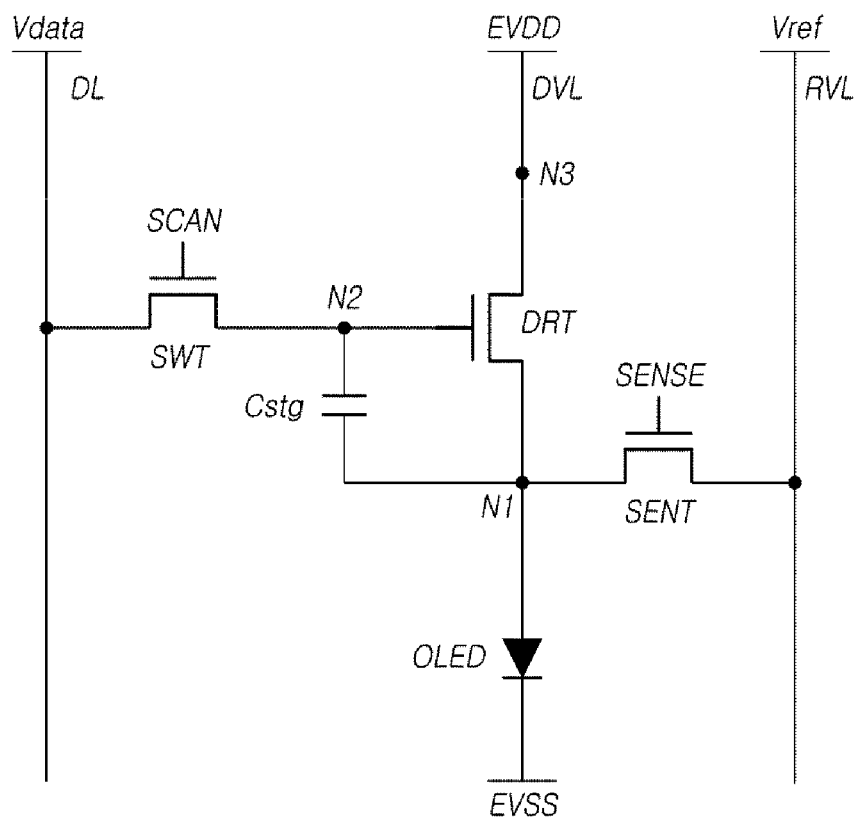
FIG. 3 illustrates another example of the sub-pixel circuit of the OLED display device according to example embodiments of the present invention.

FIG. 3 illustrates another example of the sub-pixel circuit of the OLED display device 100 according to example embodiments of the present invention.

Referring to FIG. 3, in the OLED display device 100 according to example embodiments of the present invention, each sub-pixel includes an OLED and a driving circuit.

Referring to FIG. 3, the driving circuit in the sub-pixel having a compensation structure includes, by way of example, three transistors (a driving transistor DRT, a switching transistor SWT, and a sensing transistor SENT) and one capacitor (a storage capacitor Cstg).

This type of the sub-pixel, including three transistors DRT, SWT, and SENT and one capacitor Cstg, is referred as having a "3T1C" structure.

Referring to FIG. 3, the OLED includes a first electrode (e.g. an anode electrode or a cathode electrode), an organic layer and a second electrode (e.g. a cathode electrode or an anode electrode).

For example, a source node or a drain node of the driving transistor DRT is connected to the first electrode of the OLED, and a base voltage EVSS is applied to the second electrode of the OLED.

Referring to FIG. 3, the driving transistor DRT is a transistor that supplies a driving current to the OLED to drive the OLED.

The driving transistor DRT includes a first node N1 corresponding to the source node or the drain node, a second node N2 corresponding to a gate node, and a third node N3 corresponding to the drain node or the source node. In the following description, for the sake of explanation, the first node N1 may be referred to as the source node, the second node N2 may be referred to as the gate node, and the third node N3 may be referred to as the drain node.

For example, in the driving transistor DRT, the first node N1 is electrically connected to the first electrode or the second electrode of the OLED, and the third node N3 is electrically connected to a driving voltage line DVL through which a driving voltage EVDD is supplied.

Referring to FIG. 3, the switching transistor SWT is a transistor that supplies a data voltage Vdata to the second node N2 corresponding to the gate node of the driving transistor DRT.

The switching transistor SWT is controlled by a scanning signal SCAN applied to the gate node, and is electrically connected between the second node N2 of the driving transistor DRT and a data line DL.

Referring to FIG. 3, the storage capacitor Cstg is electrically connected between the first node N1 and the second node N2 of the driving transistor DRT.

The storage capacitor Cstg serves to maintain a predetermined voltage for a one-frame time.

Referring to FIG. 3, the sensing transistor SENT newly added to the basic sub-pixel structure of FIG. 2 is controlled by a sensing signal SENSE that is a type of a scanning signal applied to the gate node, and is electrically connected between a reference voltage line RVL and the first node N1 of the driving transistor DRT.

The sensing transistor SENT is turned on to apply a reference voltage Vref supplied through the reference voltage line RVL to the first node N1 (e.g. the source node or the drain node) of the driving transistor DRT.

In addition, the sensing transistor SENT allows the voltage of the first node N1 of the driving transistor DRT to be sensed by an analog-to-digital converter (ADC) electrically connected to the reference voltage line RVL.

These functions of the sensing transistor SENT relate to the compensation for the unique characteristics of the driving transistor DRT. The unique characteristics of the driving transistor DRT include, for example, a threshold voltage Vth and mobility.

When differences occur in the unique characteristics (threshold voltage, mobility) of the driving transistors DRT in the sub-pixels, luminance differences may occur among the sub-pixels, thereby lowering image quality.

It is therefore possible to improve luminance uniformity by compensating for the unique characteristics (threshold voltage, mobility) of the driving transistors DRT in the sub-pixels by sensing the unique characteristics (threshold voltage, mobility) of the driving transistors DRT.

Briefly describing the principle of sensing the threshold voltage of the driving transistor DRT, a source following operation in which a voltage Vs of the source node (the first node N1) of the driving transistor DRT follows a voltage Vg of the gate node (the second node N2) of the driving transistor DRT is enabled, and after the voltage of the source node (the first node N1) of the driving transistor DRT is saturated, the voltage of the source node (the first node N1) of the driving transistor DRT is sensed as a sensing voltage. Based on the sensing voltage sensed in this manner, a variation in the threshold voltage of the driving transistor DRT can be determined.

Thereafter, briefly describing the principle of sensing the threshold voltage of the driving transistor DRT, a predetermined voltage is applied to the gate node (the first node N2) of the driving transistor DRT in order to define the current capability characteristics of the driving transistor DRT except for the threshold voltage Vth.

The current capability (i.e. mobility) of the driving transistor DRT is relatively determined based on the amount of the predetermined voltage charged for the predetermined time in this manner, and a correction gain for compensation is accordingly obtained.

The mobility compensation through the mobility sensing as above can be carried out for a predetermined time allowed during the operation of a screen. This consequently makes it possible to sense and compensate for the parameters of the driving transistor DRT that change in real time.

The gate node of the switching transistor SWT and the gate node of the sensing transistor SENT are electrically connected to the same gate line.

That is, a gate signal (SCAN, SENSE) is commonly applied to the gate node of the switching transistor SWT and the gate node of the sensing transistor SENT through the same gate line (GL). In this case, the scanning signal SCAN and the sensing signal SENSE are the same gate signal.

The gate node of the switching transistor SWT and the gate node of the sensing transistor SENT may be electrically connected to different gate lines, through which the scanning signal SCAN and the sensing signal SENSE are separately applied thereto.

Figure 4:
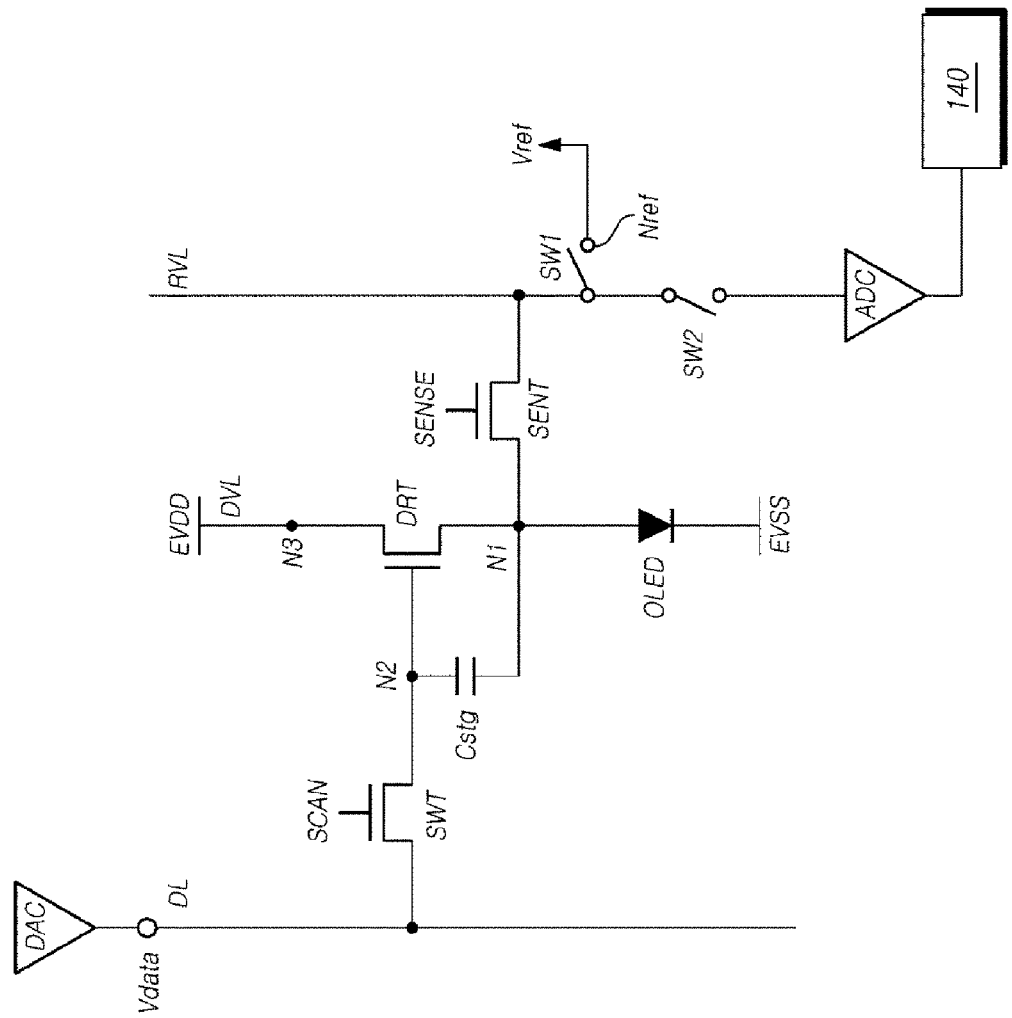
FIG. 4 illustrates an example of a sub-pixel circuit and a compensation structure of the OLED display device according to example embodiments of the present invention.

FIG. 4 illustrates an example of a sub-pixel circuit and a compensation structure (a sensing structure for compensating for a threshold voltage and mobility) of the OLED display device 100 according to example embodiments of the present invention.

The sub-pixel circuit illustrated in FIG. 4 is identical to the sub-pixel circuit illustrated in FIG. 3.

Referring to FIG. 4, the OLED display device 100 further includes an ADC that senses a voltage of a reference voltage line RVL, creates sensing data by converting the sensed voltage to a digital value, and transmits the created sensing data to the timing controller 140.

The use of the ADC enables the timing controller 140 to calculate a compensation value and compensate for data on the basis of a digital system.

The ADC is, together with a digital-to-analog converter (DAC) that converts image data to a data voltage Vdata, included in each of the source driver ICs.

Referring to FIG. 4, the OLED display device 100 includes switch components, such as a first switch SW1 and a second switch SW2, in order to provide an effective sensing operation.

The first switch SW1 connects the reference voltage line RVL and a supply node Nref of a reference voltage Vref.

When the first switch SW1 is on, the reference voltage Vref is supplied to the reference voltage line RVL. When the first switch SW1 is off, the reference voltage Vref is not supplied to the reference voltage line RVL.

The second switch SW2 connects the reference voltage line RVL and the ADC in response to a second switching signal (a sampling signal).

When the second switch is on, the reference voltage line RVL is connected to the ADC, which in turn can sense a voltage on the reference voltage line RVL.

In the case of the switch components SW1 and SW2 as described above, the OLED display device 100 can set the voltage states of the main nodes (the first node N1 and the second node N2) to the states necessary for the sensing driving, whereby effective sensing is enabled.

Figure 5:
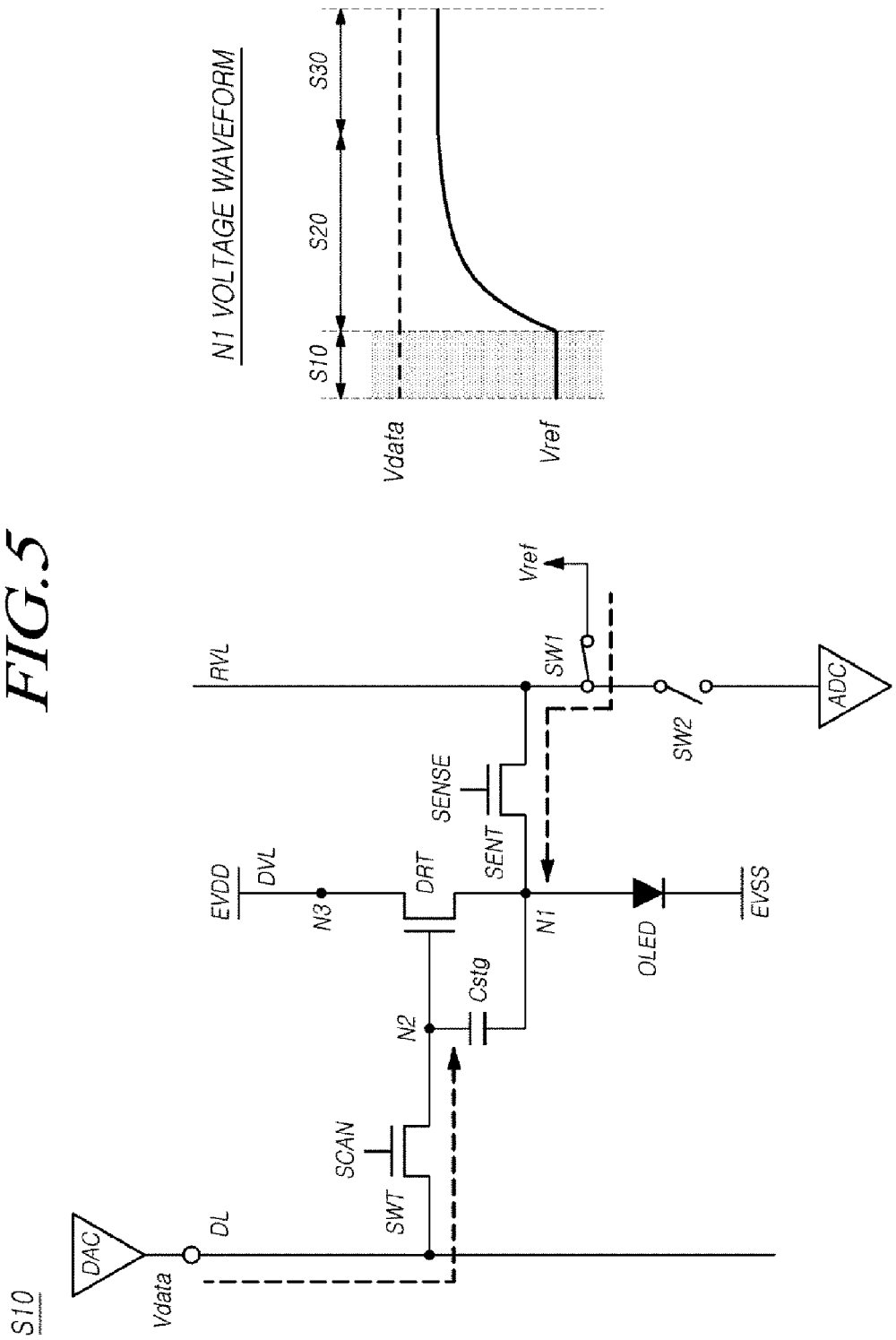
FIG. 5, FIG. 6, and FIG. 7 illustrate the sensing driving operation of the OLED display device according to example embodiments of the present invention.
Figure 6:
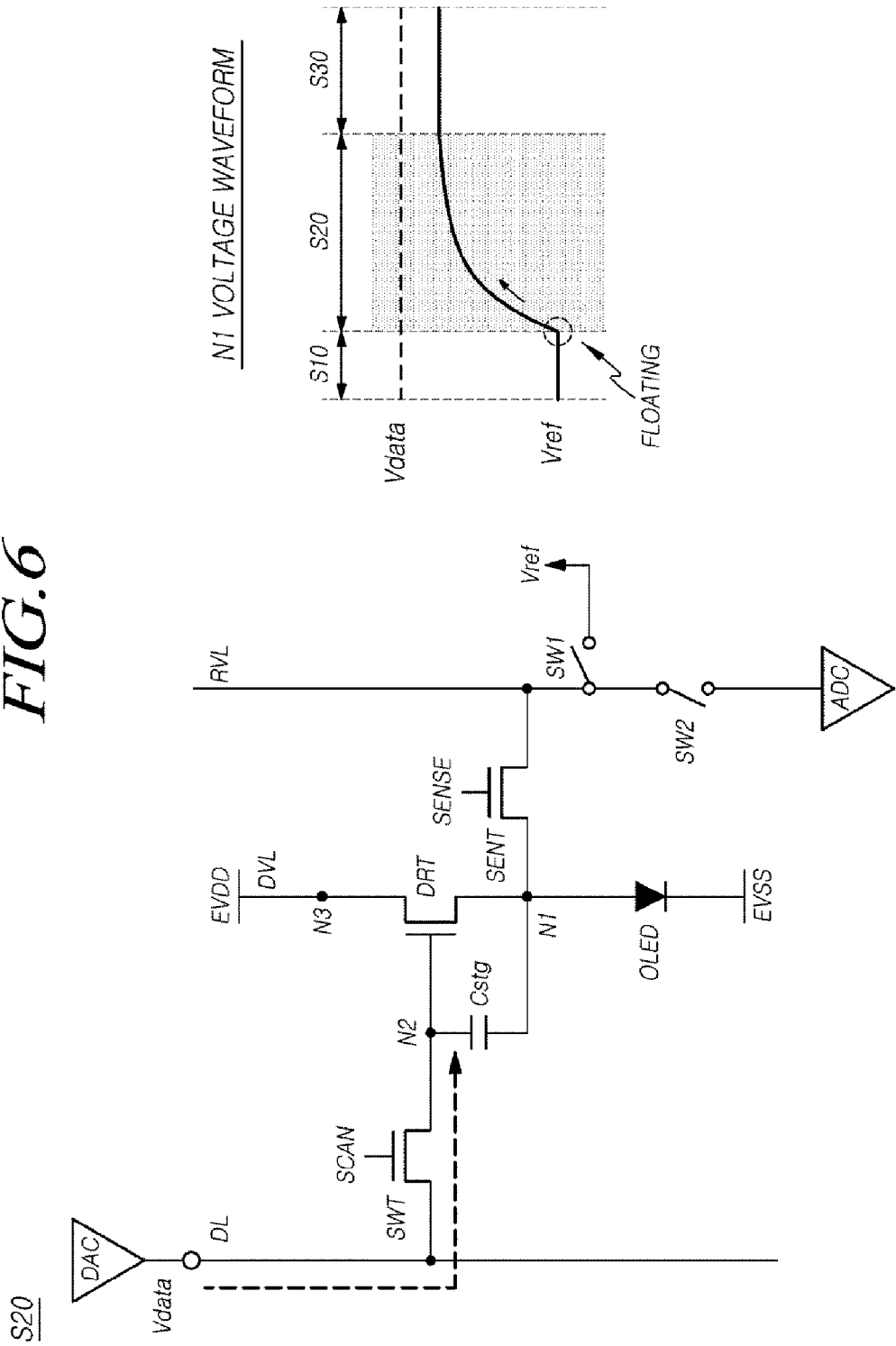
Figure 7:
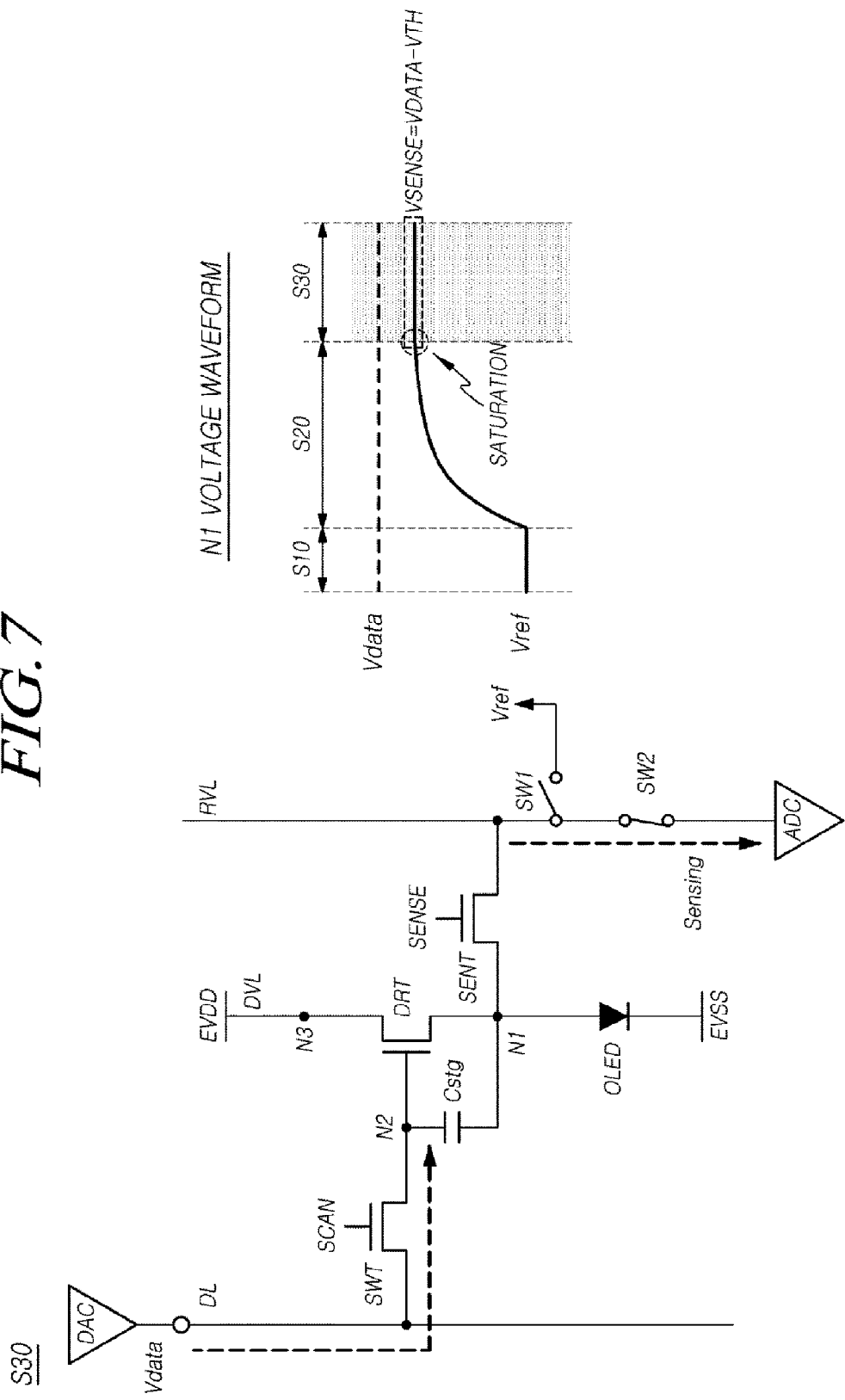

FIG. 5, FIG. 6, and FIG. 7 illustrate the sensing driving operation of the OLED display device 100 according to example embodiments of the present invention and voltage waveforms at the first node N1. A sensing operation of compensating for a threshold voltage will be described by way of example.

Referring to FIG. 5 to FIG. 7, the sensing driving operation of the OLED display device 100 according to example embodiments includes an initialization step S10, a voltage boosting step S20, and a sensing step S30.

Referring to FIG. 5, the initialization step S10 is the step of initializing the first node N1 and the second node N2 of the driving transistor DRT to a predetermined voltage.

Referring to FIG. 5, at the initialization step S10, the switching transistor SWT and the sensing transistor SENT are in a turned on state, the first switch SW1 is in an on state, and the second switch SW2 is in an off state.

With this configuration, a reference voltage Vref supplied to the reference voltage line RVL is applied to the first node N1 of the driving transistor DRT via the sensing transistor SENT.

Consequently, the first node N1 of the driving transistor DRT is initialized to the reference voltage Vref.

In addition, a data voltage Vdata converted to an analog voltage at the DAC of the source driver IC is applied to the second node N2 of the driving transistor DRT via the switching transistor SWT.

Therefore, the second node N2 of the driving transistor DRT is initialized to the data voltage Vdata.

Referring to FIG. 6, the voltage boosting step S20 is the step of boosting the voltage of the first node N1 of the driving transistor DRT.

Referring to FIG. 6, at the voltage boosting step S20, the first switch SW1 is in an off state, and the second switch SW2 is in an off state.

As the first switch SW1 is in the off state, the reference voltage Vref is not applied to the first node N1 of the driving transistor DRT. That is, the first node N1 of the driving transistor DRT floats.

Therefore, at the voltage boosting step S20, as illustrated in the N1 voltage waveform, the voltage of the first node N1 of the driving transistor DRT is boosted.

The increase in the voltage of the first node N1 of the driving transistor DRT continues until the difference in the voltage between the first node N1 and the second node N2 of the driving transistor DRT is a threshold voltage Vth.

That is, the voltage of the first node N1 is saturated when it becomes a voltage value Vdata-Vth obtained by deducting the threshold voltage Vth of the driving transistor DRT from the data voltage Vdata of the second node N2 of the driving transistor DRT.

After the voltage of the first node N1 of the driving transistor DRT is saturated, the voltage of the first node N1 of the driving transistor DRT can be sensed in order to sense the threshold voltage Vth of the driving transistor DRT.

The sensing step S30 may start after the voltage of the first node N1 of the driving transistor DRT is saturated.

Referring to FIG. 7, at the sensing step S30, the first switch SW1 is in an off state, and the second switch SW2 is in an on state. At the sensing step S30, the sensing transistor SENT stays in the turned on state.

Referring to FIG. 7, as the second switch SW2 is in the on state, the ADC can be connected to the reference voltage line RVL to sample and sense the voltage of the reference voltage line RVL.

A voltage Vsense sensed by the ADC may be the saturated voltage of the first node N1 (e.g. a source node or a drain node) of the driving transistor DRT.

Referring to the N1 node waveform, the voltage Vsense sensed by the ADC corresponds to a voltage value obtained by deducting the threshold voltage Vth of the driving transistor DRT from the data voltage Vdata.

It is therefore possible to determine the threshold voltage Vth of the driving transistor DRT of each sub-pixel and differences in the threshold voltage between the individual driving transistors DRT.

The ADC creates sensing data by converting the sensed voltage Vsense to a digital value, and transmits the sensing data to the timing controller 140.

The timing controller 140 receives the sensing data, determines a difference in the threshold voltage based on the sensing data, and decides and stores a data compensation value of each sub-pixel for compensation for the difference.

The timing controller 140 changes image data based on the data compensation value, and transmits the changed image data to a corresponding source driver IC. Consequently, the source driver IC converts the changed image data to a data voltage using the DAC, and outputs the data voltage to a corresponding data line. In this manner, substantial compensation is performed.

Parasitic capacitance components may be present on the transistors and a variety of signal lines of the OLED display panel 110. The parasitic capacitance components may produce resistance capacitance (RC) loads.

The RC loads due to the parasitic capacitance components may cause voltage characteristics to be unstable during the sensing operation. Variations are experienced while voltage values are being sensed. This may significantly reduce the accuracy of sensing.

As the accuracy of sensing is reduced, the timing controller 140 may have an inaccurate compensation value when calculating the compensation value. Therefore, image quality may become worse regardless of the compensation intended to improve luminance differences.

Accordingly, embodiments of the present invention provide a sensing driving stabilizing method in order to prevent a sensed value from being changed by an unstable potential during the sensing operation, thereby preventing the compensation value from being inaccurate.

Figure 8:
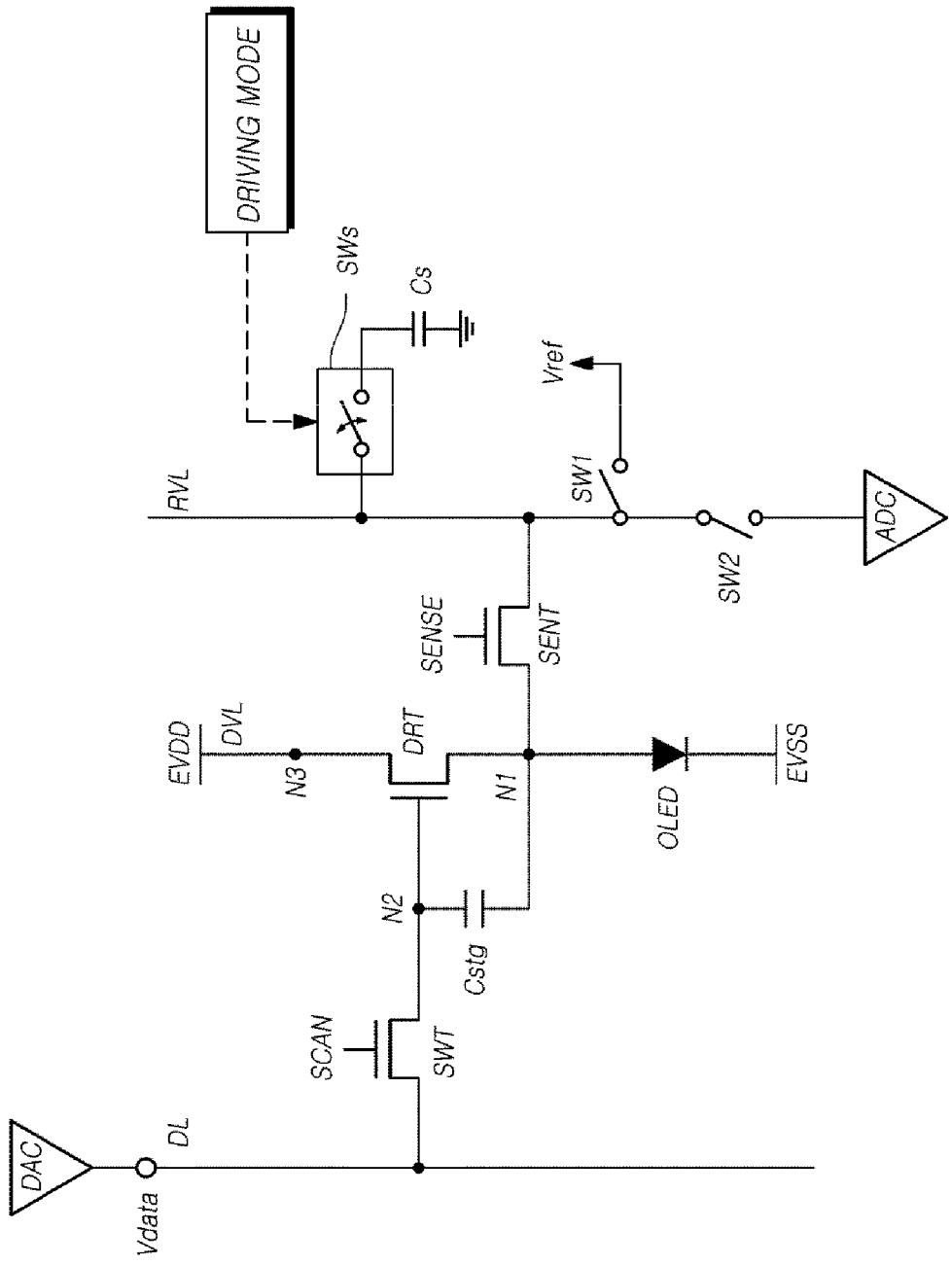
FIG. 8 illustrating a sensing driving stabilizer of the OLED display device according to example embodiments of the present invention.
Figure 9:
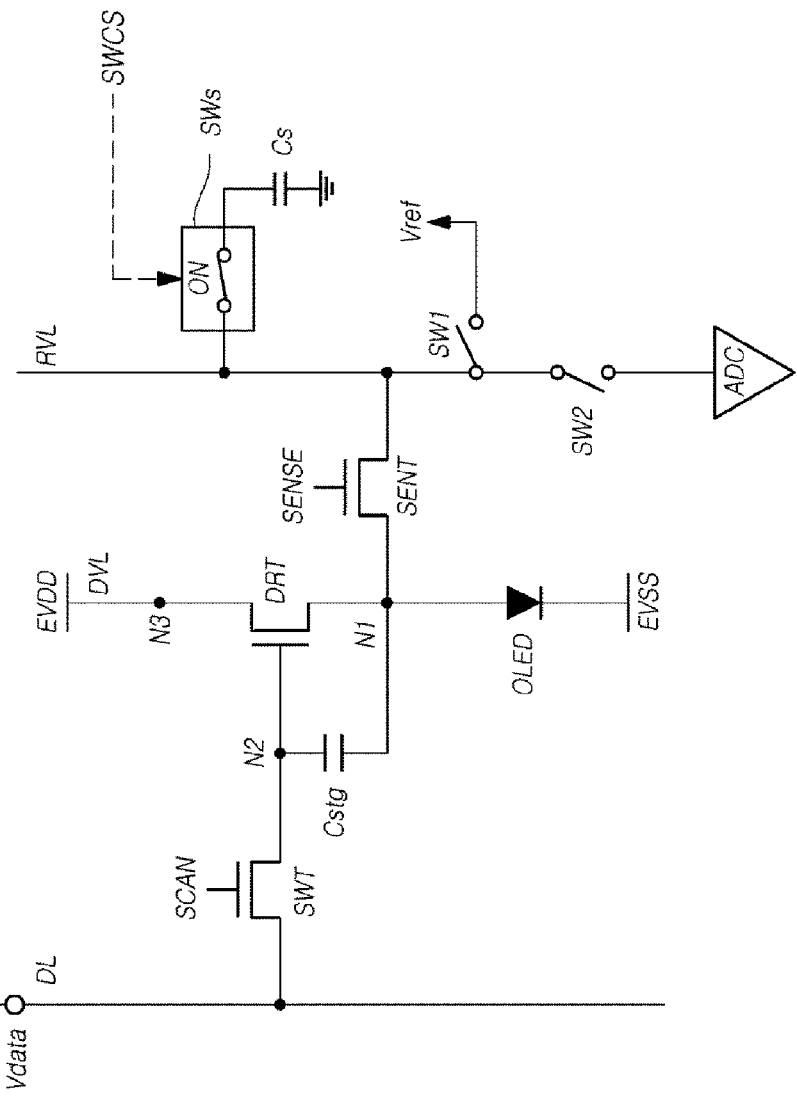
FIG. 9 illustrates the state of the sensing driving stabilizer when the GELD display device according to example embodiments of the present invention performs the sensing driving operation.
Figure 10:
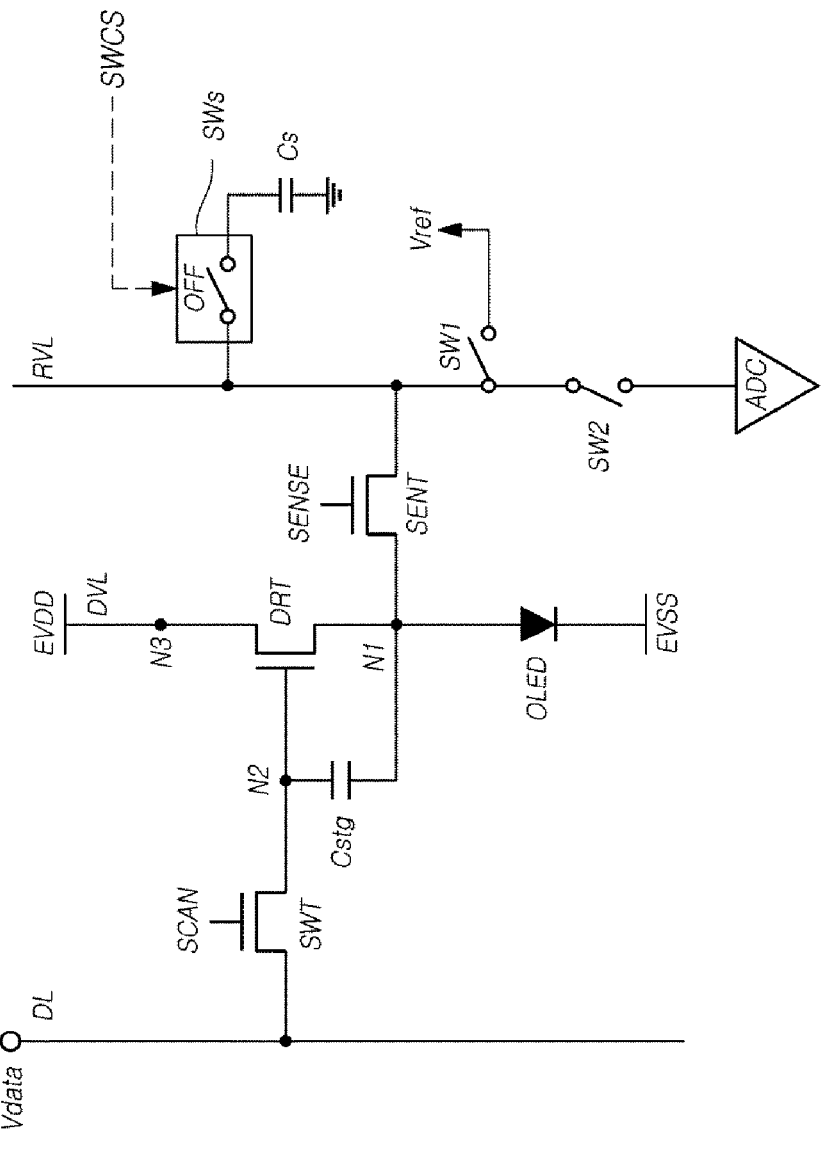
FIG. 10 illustrates the state of the sensing driving stabilizer when the GELD display device according to example embodiments of the present invention performs the display driving operation.

FIG. 8 illustrates a sensing driving stabilizer of the OLED display device 100 according to example embodiments of the present invention, FIG. 9 illustrates the state of the sensing driving stabilizer when the GELD display device 100 according to example embodiments of the present invention performs the sensing driving operation, and FIG. 10 illustrates the state of the sensing driving stabilizer when the GELD display device 100 according to example embodiments of the present invention performs the display driving operation.

Referring to FIG. 8, the GELD display device 100 according to example embodiments of the present invention further includes a stabilizing capacitor Cs for stabilizing the sensing driving in order to prevent the compensation value from having an error due to a variation in the sensing value. The stabilizing capacitor Cs is selectively electrically connected to or disconnected from the reference voltage line RVL depending on the driving mode.

When the driving mode is the sensing driving mode, the stabilizing capacitor Cs is electrically connected to the reference voltage line RVL as illustrated in FIG. 9. When the driving mode is the normal driving mode (i.e. the display driving mode), the stabilizing capacitor Cs is not electrically connected to the reference voltage line RVL as illustrated in FIG. 10.

In the section of the sensing driving mode, i.e. during the sensing operation, the stabilizing capacitor Cs is connected to the reference voltage line RVL to stabilize a variation in the voltage of the reference voltage line RVL.

During the sensing operation, the reference voltage line RVL allows a current to flow through the driving transistor DRT of each sub-pixel. The current flowing through the reference voltage line RVL charges the entire capacitors on the reference voltage line RVL, thereby increasing the voltage of the reference voltage line RVL. This process of increasing the voltage is performed at the voltage boosting step S20.

The rate at which the voltage increases is decided based on the total capacitance of the reference voltage line RVL. The addition of the stabilizing capacitor Cs increases the total capacitance of the reference voltage line RVL, thereby increasing the rate at which the voltage increases. Consequently, the sensing can be executed more rapidly.

In addition, since almost no current flows through the driving transistor DRT at a time close to the end of the sensing, the sensing voltage of the reference voltage line RVL may be expressed more accurately with the desired voltage component (ex. Vdata–Vth) without other unnecessary voltage components (ex. EVDD, EVSS etc.). The desired voltage component may well reflect the characteristics (ex. Vth etc.) of the driving transistor DRT.

As described above, the stabilizing capacitor Cs is electrically connected to the reference voltage line RVL in the section of the sensing driving mode, and is not connected to the reference voltage line RVL in the section of the display driving mode.

The stabilizing capacitor Cs is connected to the reference voltage line RVL only in the section of the sensing driving mode as above, such that the potential of the reference voltage line RVL can be stabilized for the period of the sensing driving, thereby increasing the accuracy of a sensed value. This can consequently produce an accurate compensation value, thereby helping an improvement in image quality.

In order to control the stabilizing capacitor Cs to be connected to or disconnected from the reference voltage line RVL depending on the driving mode as above, the GELD display device 100 according to example embodiments of the present invention further includes a switching device SWs, as illustrated in FIG. 8. The switching device SWs electrically connects the reference voltage line RVL and the stabilizing capacitor Cs only during the sensing driving in response to a switching control signal SWCS.

The switching device SWs enables the stabilizing capacitor Cs to be efficiently connected to the reference voltage line RVL depending on the driving mode.

The stabilizing capacitor Cs additionally connectable to the reference voltage line RVL during the sensing driving may be disposed on or outside the OLED display panel 110.

When the stabilizing capacitor Cs is disposed on the OLED display panel 110, it is possible to form the stabilizing capacitor Cs together with the other patterns in the fabrication process of the OLED display panel 110, thereby advantageously realizing the stabilizing capacitor Cs without additional processing.

In contrast, when the stabilizing capacitor Cs is disposed outside the OLED display panel 110, the stabilizing capacitor Cs may be disposed, for example, on a film, such as the flexible printed circuit (FPC) on which the source driver IC is disposed. This configuration improves the efficiency of the sensing operation performed by the ADC corresponding to the sensing configuration, which may be disposed inside the source driver IC, and decreases the length of sensing, thereby improving the accuracy of sensing to a certain degree. The source driver IC disposed on the film, such as the FPC, is referred to as a chip on film (COF) type source driver IC.

The above-stated switching device SWs may be a transistor controlled in response to the switching control signal SWCS applied to a gate node of the transistor. The transistor is electrically connected between the reference voltage line RVL and a first plate of the stabilizing capacitor Cs.

The use of the switching device SWs enables the connection between the reference voltage line RVL and the stabilizing capacitor Cs to be more efficiently controlled.

As described above, the stabilizing capacitor Cs may be disposed on the OLED display panel 110 or outside the OLED display panel 110.

Figure 11:
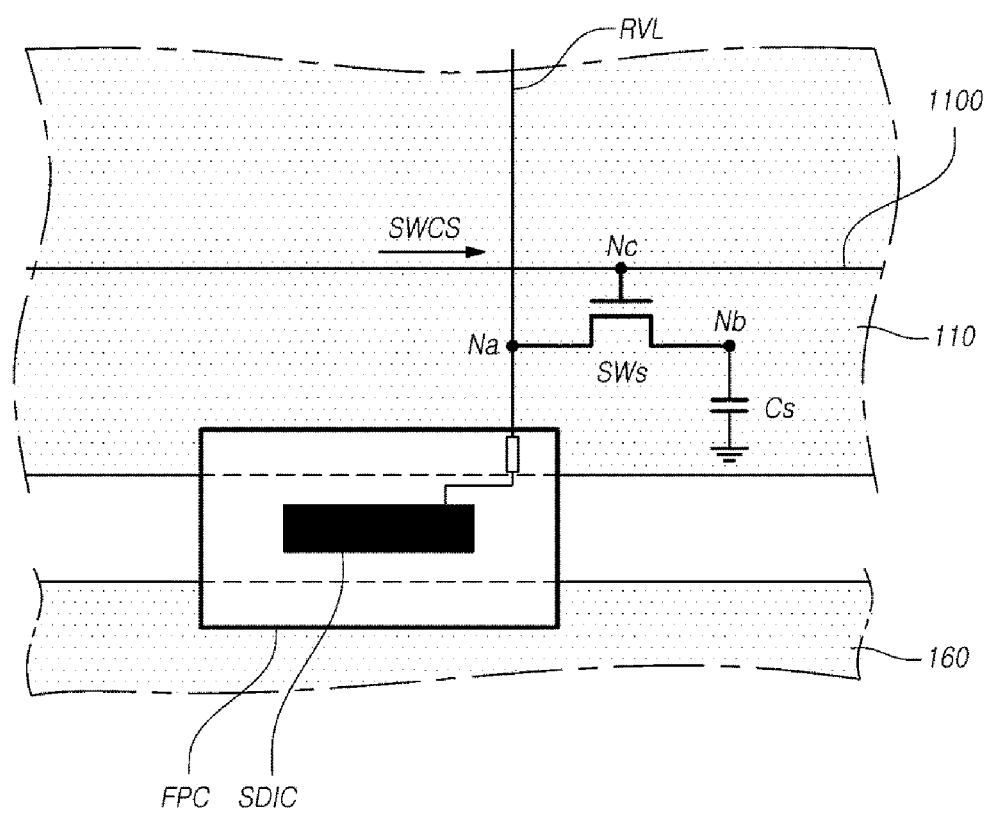
FIG. 11 and FIG. 12 illustrate the sensing driving stabilizer of the GELD display device according to example embodiments of the present invention formed on an OLED display panel.
Figure 12:
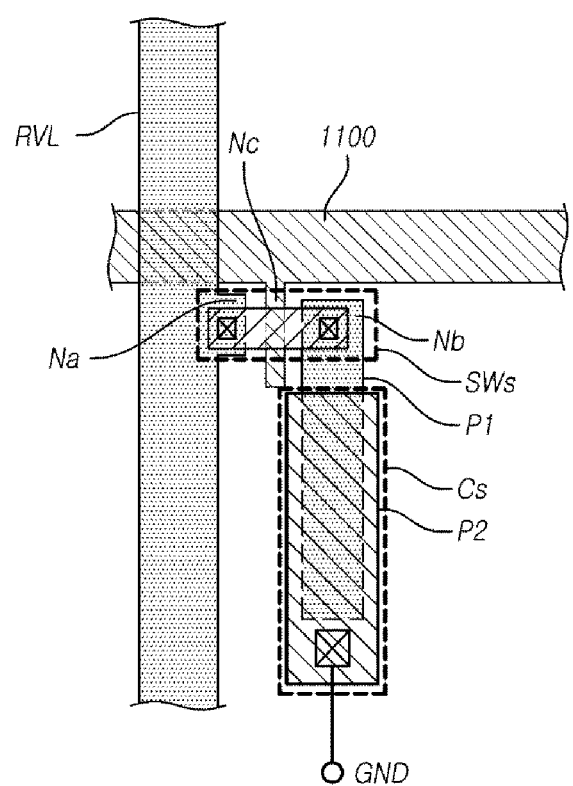

With reference to FIG. 11 and FIG. 12, a description of the formation of the stabilizing capacitor Cs on the OLED display panel 110 will be described by way of example. In addition, with reference to FIG. 13, a description of the formation of the stabilizing capacitor Cs on the FPC will be described as an example of the case in which the stabilizing capacitor Cs is disposed outside the OLED display panel 110.

FIG. 11 and FIG. 12 illustrate the sensing driving stabilizer of the GELD display device 100 according to example embodiments of the present invention formed on the OLED display panel 110. In FIG. 12, the switching device SWs is illustrated as being a planar thin-film transistor (TFT). However, this is not intended to be limiting, and the switching device may be implemented as a variety of transistor structures.

Referring to FIG. 11 and FIG. 12, the stabilizing capacitor Cs and the switching device SWs can be formed when a variety of patterns (transistors, capacitors, and voltage lines) are formed on the OLED display panel 110 during the fabrication process of the OLED display panel 110.

Referring to FIG. 11 and FIG. 12, when the stabilizing capacitor Cs and the switching device SWs are disposed on the OLED display panel 110, a gate wire 1100 through which a switching control signal SWCS is applied to the gate node of the switching device SWs is further disposed on the OLED display panel 110.

Since the gate wire 1100 is additionally disposed on the OLED display panel 110 in this manner, it is possible to apply the SWCS to the gate node of the switching device SWs through the gate wire 1100, thereby more efficiently controlling the switching operation of the switching device SWs.

The above-stated SWCS may be output, for example, as a gate control signal (GCS) from the gate driver 130.

Referring to FIG. 11 and FIG. 12, the switching device SWs has Na, Nb and Nc nodes. The Na node of the switching device SWs is a drain node or a source node electrically connected to the reference voltage line RVL. The Nb node of the switching device SWs is a source node or a drain node electrically connected to a first plate P1 of the stabilizing capacitor Cs.

Referring to FIG. 11 and FIG. 12, the stabilizing capacitor Cs includes the first plate P1 and a second plate P2.

The first plate P1 of the stabilizing capacitor Cs is electrically connected to the Nb node of the switching device SWs. The second plate P2 of the stabilizing capacitor Cs is electrically connected to a ground voltage terminal GND.

As illustrated in FIG. 12, the first plate P1 of the stabilizing capacitor Cs and the Nb node of the switching device SWs are integrally formed as a metal plate.

As the above-stated sensing stabilizer, the stabilizing capacitor Cs, the switching device SWs, and the like may be disposed outside an active area of the OLED display panel 110 on which images are displayed, i.e. on an area of the OLED display panel 110 on which no images are displayed.

As described above, the stabilizing capacitor Cs, the switching device SWs, the gate wire 1100, and the like acting as the sensing stabilizer are effectively disposed on the OLED display panel 110.

Figure 13:
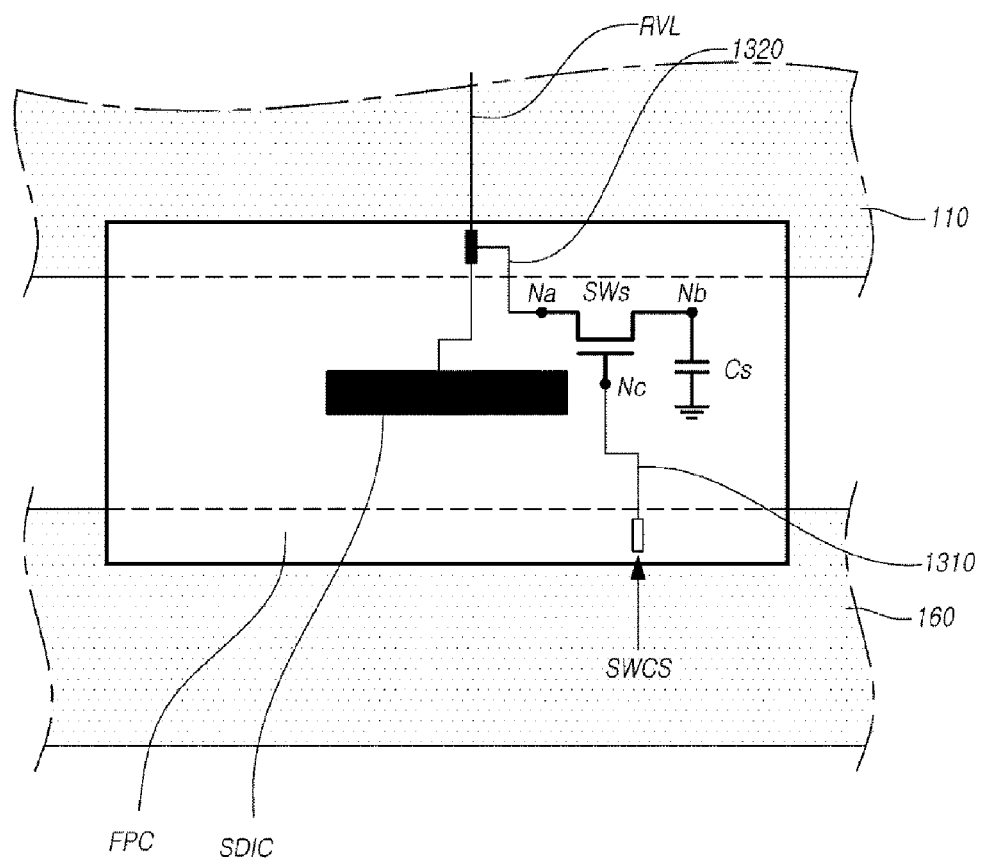
FIG. 13 illustrates the sensing driving stabilizer of the GELD display device according to example embodiments of the present invention formed on an FPC.

FIG. 13 illustrates the sensing driving stabilizer of the OLED display device 100 according to example embodiments of the present invention formed on the FPC.

Referring to FIG. 13, the OLED display device 100 according to example embodiments of the present invention further includes an FPC, in which one end of the FPC is connected to the OLED display panel 110, and the other end of the FPC is connected to the source PCB 160. A source driver IC SDIC included in the data driver 120 is disposed on the FPC.

Referring to FIG. 13, as the sensing driving stabilizer, the stabilizing capacitor Cs and the switching device SWs are disposed on the FPC.

Referring to FIG. 13, the Na node (the drain node or the source node) of the switching device SWs is electrically connected to the reference voltage line RVL, and the Nb node (the source node or the drain node) of the switching device SWs is electrically connected to the first plate of the stabilizing capacitor Cs.

Referring to FIG. 13, the FPC may have a two-layer structure. In the two-layer structure of the FPC, one layer may act as the first plate of the stabilizing capacitor Cs, and the other layer corresponding to a ground metal layer may act as the second plate of the stabilizing capacitor Cs, thereby forming the stabilizing capacitor Cs.

A switching control signal wire 1310 through which the switching control signal SWCS is applied to the gate node Nc of the switching device SWs is disposed on the FPC.

Since the sensing driving stabilizer, such as the stabilizing capacitor Cs, the switching device SWs, and the switching control signal wire 1310, are disposed on the FPC outside the OLED display panel 110 as described above, it is not required to change the fabrication process of the OLED display panel 110. In addition, since the sensing driving stabilizer, such as the stabilizing capacitor Cs, the switching device SWs, and the switching control signal wire 1310, are disposed on the FPC on which the source driver IC SDIC is disposed, the length from the ADC corresponding to the sensing component inside the source driver IC SDIC to a sensing point (the stabilizing capacitor Cs connected to the reference voltage line RVL) is reduced, thereby improving the accuracy of sensed values.

Referring to FIG. 13, a connecting wire 1320 that electrically connects the Na node (the drain node or the source node) of the switching device SWs and the reference voltage line RVL on the OLED display panel 110 is disposed on the FPC.

The point where the connecting wire 1320 and the reference voltage line RVL are connected to each other is positioned on the portion where the FPC and the OLED display panel 110 are bonded to each other.

In this manner, the switching device SWs is electrically connected to the reference voltage line RVL via the connecting wire 1320.

Referring to FIG. 13, the switching control signal SWCS can be supplied to the switching control signal wire 1310 disposed on the FPC via the source PCB 160.

With this configuration, the switching operation of the switching device SWs can be efficiently controlled.

Figure 14:
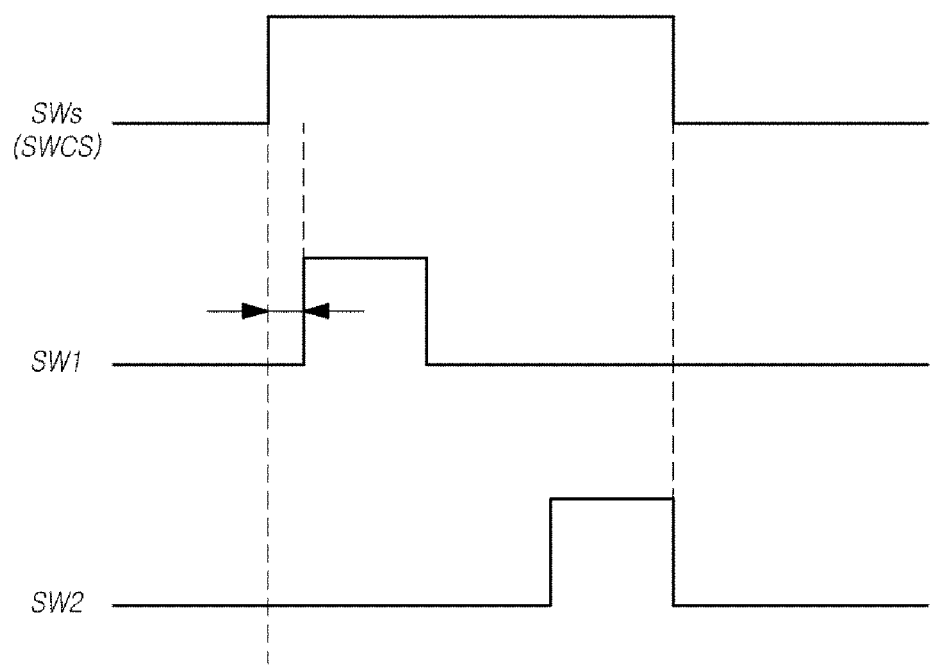
FIG. 14 illustrates a timing diagram for a switching device SWs in the sensing driving stabilizer of the GELD display device according to example embodiments of the present invention.

FIG. 14 illustrates a timing diagram for a switching device SWs in the sensing driving stabilizer of the GELD display device according to example embodiments of the present invention.

Referring to FIG. 14, the switching device SWs may be on-state during the sensing driving mode (S10, S20, and S30).

Referring to FIG. 14, the switching device SWs may be turned-on before the first switch SW1 is turned-on at the initialization step S10 in the sensing driving mode. And the switching devices SWs may be turned-off when the second switch SW2 is turned-off at the sensing step S30 in the sensing driving mode. The switching devices SWs may also be turned-off after the second switch SW2 is turned-off at the sensing step S30 in the sensing driving mode FIG. 15 illustrates another timing diagram for a switching device SWs in the sensing driving stabilizer of the GELD display device according to example embodiments of the present invention.

Figure 15:
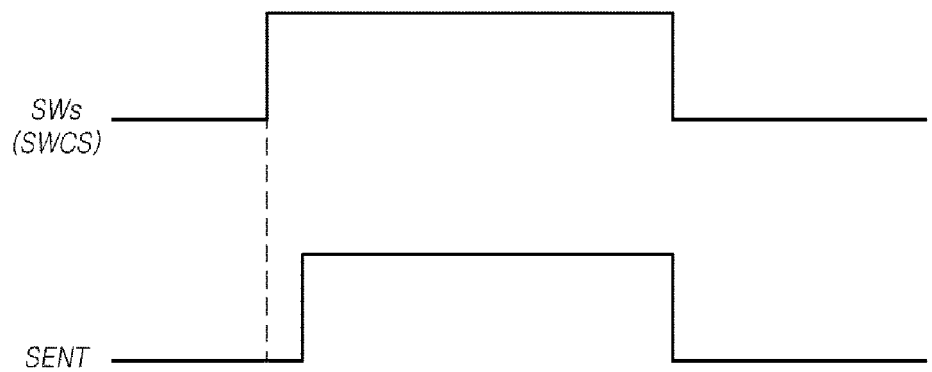
FIG. 15 illustrates another timing diagram for a switching device SWs in the sensing driving stabilizer of the GELD display device according to example embodiments of the present invention.

Referring to FIG. 15. The switching device SWs is controlled with the timing equal to or corresponded with a control timing of the sensing transistor SENT.

As described above, according to example embodiments of the present invention, the OLED display device 100 and the OLED display panel 110 increase the accuracy of sensing data in sensing the characteristics of the driving transistor, whereby accurate compensation is enabled.

In addition, according to example embodiments of the present invention, the OLED display panel 100 and the OLED display device 110 have the sensing driving stabilizer that can increase accuracy in sensing the characteristics of the driving transistor.

Furthermore, according to example embodiments of the present invention, the OLED display panel 100 and the OLED display device 110 have the sensing driving stabilizer that can increase accuracy in sensing and compensation by providing potential stability to the reference voltage line acting as a sensing line during the sensing driving.

In accordance with example embodiments of the present invention, an OLED display panel and an OLED display device may have increased accuracy in sensing the characteristics of a driving transistor, whereby accurate compensation is enabled.

Further, an OLED display panel and an OLED display device may have a sensing driving stabilizer (including, e.g., the stabilizing capacitor) that can increase accuracy in sensing the characteristics of the driving transistor.

Moreover, an OLED display panel and an OLED display device may have a sensing driving stabilizer that can increase accuracy in sensing and compensation by providing potential stability to a reference voltage line acting as a sensing line during the sensing driving.

It will be apparent to those skilled in the art that various modifications and variations can be made in the OLED display panel and the OLED display device of the present invention without departing from the spirit or scope of the invention. Thus, it is intended that the present invention cover the modifications and variations of this invention provided they come within the scope of the appended claims and their equivalents.

What is claimed is:

1. An organic light-emitting diode display device, comprising:
    an organic light-emitting diode display panel on which a plurality of data lines, a plurality of gate lines, and a plurality of sub-pixels are disposed;
    a data driver configured to drive the plurality of data lines;
    a gate driver configured to drive the plurality of gate lines;
    a timing controller configured to control the data driver and the gate driver;
    wherein each of the sub-pixels comprises:
        an organic light-emitting diode;
        a driving transistor configured to drive the organic light-emitting diode;
        a sensing transistor electrically connected between a first node of the driving transistor and a reference voltage line;
        a switching transistor electrically connected between a second node of the driving transistor and a data line; and
        a storage capacitor electrically connected between the first node and the second node of the driving transistor; and
    a stabilizing capacitor configured to be electrically connected to or disconnected from the reference voltage line depending on a driving mode.

2. The organic light-emitting diode display device according to claim 1, wherein the stabilizing capacitor is disposed on the organic light-emitting diode display panel or outside the organic light-emitting diode display panel.

3. The organic light-emitting diode display device according to claim 1, further configured to electrically connect the stabilizing capacitor to the reference voltage line in a section of a sensing driving mode, and electrically disconnect the stabilizing capacitor from the reference voltage line in a section of a display driving mode.

4. The organic light-emitting diode display device according to claim 3, further comprising a switching device configured to electrically connect the reference voltage line and the stabilizing capacitor in response to a switching control signal only in sensing driving.

5. The organic light-emitting diode display device according to claim 4, wherein the switching device comprises a transistor, the switching device configured to be controlled in response to the switching control signal applied to a gate node thereof, and being electrically connected between the reference voltage line and a first plate of the stabilizing capacitor.

6. The organic light-emitting diode display device according to claim 5, wherein
    the stabilizing capacitor and the switching device are disposed on the organic light-emitting diode display panel, and
    a gate wire through which the switching control signal is applied to the gate node of the switching device is further disposed on the organic light-emitting diode display panel.

7. The organic light-emitting diode display device according to claim 6, wherein one node of a drain node and a source node of the switching device is electrically connected to the reference voltage line, the other node of the source node and the drain node of the switching device is electrically connected to the first plate of the stabilizing capacitor, and a second plate of the stabilizing capacitor is electrically connected to a ground voltage terminal.

8. The organic light-emitting diode display device according to claim 5, further comprising a flexible printed circuit, wherein one end of the flexible printed circuit is connected to the organic light-emitting diode display panel, the other end of the flexible printed circuit is connected to a source printed circuit board, and a source driver integrated circuit of the data driver is disposed on the flexible printed circuit, wherein
    the stabilizing capacitor and the switching device are disposed on the flexible printed circuit, and
    a switching control signal wire through which the switching control signal is applied to the gate node of the switching device is further disposed on the flexible printed circuit.

9. The organic light-emitting diode display device according to claim 8, wherein a connecting wire electrically connecting one node of a drain node and a source node of the switching device and the reference voltage line on the organic light-emitting diode display panel is further disposed on the flexible printed circuit.

10. The organic light-emitting diode display device according to claim 8, wherein the switching control signal wire disposed on the flexible printed circuit is configured to receive the switching control signal via the source printed circuit board.

11. The organic light-emitting diode display device according to claim 4, wherein the switching device is on-state during the sensing driving mode, or
the switching device is controlled with a timing equal to or corresponded with a control timing of the sensing transistor.

12. An organic light-emitting diode display panel, comprising:
a plurality of data lines;
a plurality of gate lines arranged in a direction crossing the plurality of data lines; and
a plurality of sub-pixels arranged in a shape of a matrix, wherein each of the sub-pixels comprises:
an organic light-emitting diode;
a driving transistor configured to drive the organic light-emitting diode;
a sensing transistor electrically connected between a first node of the driving transistor and a reference voltage line;
a switching transistor electrically connected between a second node of the driving transistor and a data line; and
a storage capacitor electrically connected between the first node and the second node of the driving transistor; and
a stabilizing capacitor configured to be electrically connected to or disconnected from the reference voltage line depending on a driving mode.

13. The organic light-emitting diode display panel according to claim 12, further configured to electrically connect the stabilizing capacitor to the reference voltage line in a section of a sensing driving mode, and to electrically disconnect the stabilizing capacitor from the reference voltage line in a section of a display driving mode.

14. The organic light-emitting diode display panel according to claim 13, further comprising a switching device configured to electrically connect the reference voltage line and the stabilizing capacitor in response to a switch control signal only in sensing driving.

* * * * *